United States Patent
Strain

(10) Patent No.: US 7,863,689 B2
(45) Date of Patent: Jan. 4, 2011

(54) APPARATUS FOR USING A WELL CURRENT SOURCE TO EFFECT A DYNAMIC THRESHOLD VOLTAGE OF A MOS TRANSISTOR

(75) Inventor: Robert Strain, San Jose, CA (US)

(73) Assignee: Semi Solutions, LLC., Los Gatos, CA (US)

( * ) Notice: Subject to any disclaimer, the term of this patent is extended or adjusted under 35 U.S.C. 154(b) by 0 days.

(21) Appl. No.: 12/348,809

(22) Filed: Jan. 5, 2009

(65) Prior Publication Data

US 2009/0206380 A1      Aug. 20, 2009

Related U.S. Application Data

(63) Continuation-in-part of application No. 11/533,332, filed on Sep. 19, 2006, now Pat. No. 7,683,433.

(60) Provisional application No. 61/006,306, filed on Jan. 4, 2008.

(51) Int. Cl.
- *H01L 29/76* (2006.01)
- *H01L 29/94* (2006.01)
- *H01L 31/062* (2006.01)
- *H01L 31/113* (2006.01)
- *H01L 31/119* (2006.01)

(52) U.S. Cl. .............. 257/379; 257/369; 257/373; 327/540; 327/543

(58) Field of Classification Search ............ 257/369, 257/373, 374, 379; 327/540, 541, 543
See application file for complete search history.

(56) References Cited

U.S. PATENT DOCUMENTS

3,921,035 A    11/1975   Holmes (Continued)

FOREIGN PATENT DOCUMENTS

TW              419854            1/2001

(Continued)

OTHER PUBLICATIONS

Vora, M., et al., "A 2 Micron High Performance Bipolar 64K ECL Static RAM Technology With 200 Square Microns Contactless Memory Cell," 1984, IEDM Technical Digest 1984, pp. 690-693.

(Continued)

*Primary Examiner*—Phuc T Dang
(74) *Attorney, Agent, or Firm*—Michael A. Glenn; Glenn Patent Group

(57) ABSTRACT

Deep submicron wells of MOS transistors, implemented over an ungrounded well, exhibit two modes of operation: a current sink mode and a current source mode. While operation as a current sink is well understood and successfully controlled, it is also necessary to control the current provided in the current source mode of the well. A Schottky diode is connected between the well and the gate, the Schottky diode having a smaller barrier height than that of the PN junction of the well-to-source. For an NMOS transistor, current flows through the PN junction when the gate is high. When the gate is low, current flows through the Schottky diode. This difference of current flow results in a difference in transistor threshold, thereby achieving a dynamic threshold voltage using the current from the well when operating at the current source mode.

9 Claims, 6 Drawing Sheets

U.S. PATENT DOCUMENTS

| | | | |
|---|---|---|---|
| 4,412,308 A | 10/1983 | Bereron | |
| 4,418,468 A | 12/1983 | Vora et al. | |
| 4,616,404 A | 10/1986 | Wang et al. | |
| 4,679,170 A | 7/1987 | Bourassa et al. | |
| 5,168,337 A | 12/1992 | Muto et al. | |
| 5,266,831 A | 11/1993 | Phipps et al. | |
| 5,365,102 A | 11/1994 | Mehrotra et al. | |
| 5,416,443 A | 5/1995 | Cranford et al. | |
| 5,440,243 A | 8/1995 | Lyon | |
| 5,559,451 A | 9/1996 | Okamura | |
| 5,701,093 A | 12/1997 | Suzuki | |
| 5,717,237 A | 2/1998 | Chi | |
| 5,753,955 A | 5/1998 | Fechner | |
| 5,760,449 A | 6/1998 | Welch | |
| 5,763,960 A | 6/1998 | Ceccherelli et al. | |
| 5,804,470 A | 9/1998 | Wollesen | |
| 5,821,769 A | 10/1998 | Douseki | |
| 5,831,451 A | 11/1998 | Bosshart | |
| 5,856,708 A | 1/1999 | Wollesen | |
| 5,886,381 A * | 3/1999 | Frisina | 257/328 |
| 5,985,722 A * | 11/1999 | Kishi | 438/275 |
| 6,018,168 A | 1/2000 | Yang | |
| 6,034,563 A | 3/2000 | Mashiko | |
| 6,081,107 A | 6/2000 | Marino | |
| 6,177,703 B1 | 1/2001 | Cunningham | |
| 6,194,276 B1 | 2/2001 | Chan et al. | |
| 6,198,173 B1 | 3/2001 | Huang | |
| 6,204,105 B1 | 3/2001 | Jung | |
| 6,204,696 B1 | 3/2001 | Krishnamurthy et al. | |
| 6,225,827 B1 | 5/2001 | Fujii et al. | |
| 6,232,163 B1 | 5/2001 | Voldmann et al. | |
| 6,294,816 B1 | 9/2001 | Baukus et al. | |
| 6,359,477 B1 | 3/2002 | Pathak | |
| 6,384,639 B1 | 5/2002 | Chen et al. | |
| 6,411,560 B1 | 6/2002 | Tanizaki et al. | |
| 6,429,482 B1 | 8/2002 | Culp et al. | |
| 6,441,647 B2 | 8/2002 | Jeon | |
| 6,465,849 B1 * | 10/2002 | Chang et al. | 257/369 |
| 6,521,948 B2 | 2/2003 | Ebina | |
| 6,573,549 B1 | 6/2003 | Deng et al. | |
| 6,593,799 B2 | 7/2003 | De et al. | |
| 6,600,187 B2 | 7/2003 | Kim | |
| 6,621,292 B2 | 9/2003 | Sakata et al. | |
| 6,628,551 B2 | 9/2003 | Jain | |
| 6,643,199 B1 | 11/2003 | Tang et al. | |
| 6,645,820 B1 | 11/2003 | Peng et al. | |
| 6,674,123 B2 | 1/2004 | Kim | |
| 6,690,039 B1 | 2/2004 | Nemati et al. | |
| 6,693,333 B1 | 2/2004 | Yu | |
| 6,707,708 B1 | 3/2004 | Alvandpour et al. | |
| 6,711,063 B1 | 3/2004 | Dejenfelt et al. | |
| 6,711,088 B2 | 3/2004 | Hayashi et al. | |
| 6,787,850 B1 | 9/2004 | Pelloie | |
| 6,891,389 B1 | 5/2005 | Walker et al. | |
| 6,894,324 B2 | 5/2005 | Ker et al. | |
| 6,898,116 B2 | 5/2005 | Peng | |
| 6,933,573 B2 * | 8/2005 | Ker et al. | 257/355 |
| 6,933,744 B2 | 8/2005 | Das et al. | |
| 6,940,317 B2 | 9/2005 | Suga | |
| 6,958,519 B2 | 10/2005 | Gonzalez et al. | |
| 6,969,888 B2 | 11/2005 | Williams et al. | |
| 6,985,026 B2 | 1/2006 | Toyoyama | |
| 7,064,942 B2 | 6/2006 | Ker et al. | |
| 7,132,711 B2 | 11/2006 | Forbes et al. | |
| 7,253,485 B2 | 8/2007 | Shibahara | |
| 7,586,155 B2 * | 9/2009 | Kapoor | 257/363 |
| 2001/0054886 A1 | 12/2001 | Takahashi et al. | |
| 2002/0031028 A1 | 3/2002 | Forbes et al. | |
| 2002/0096723 A1 | 7/2002 | Awaka | |
| 2002/0153957 A1 | 10/2002 | Jordanov | |
| 2002/0154462 A1 | 10/2002 | Ker et al. | |
| 2002/0185681 A1 | 12/2002 | Nakano et al. | |
| 2002/0191436 A1 | 12/2002 | Kobayashi et al. | |
| 2002/0195623 A1 | 12/2002 | Horiuchi | |
| 2003/0089951 A1 | 5/2003 | Ker et al. | |
| 2003/0178648 A1 | 9/2003 | Bansal | |
| 2004/0004298 A1 | 1/2004 | Madurawe | |
| 2004/0022109 A1 | 2/2004 | Yoon et al. | |
| 2004/0077151 A1 | 4/2004 | Bhattacharyya | |
| 2004/0252546 A1 | 12/2004 | Liaw | |
| 2005/0035410 A1 | 2/2005 | Yeo et al. | |
| 2007/0114582 A1 | 5/2007 | Shiu et al. | |
| 2008/0048266 A1 * | 2/2008 | Russ et al. | 257/355 |
| 2008/0230851 A1 | 9/2008 | Fukui | |

FOREIGN PATENT DOCUMENTS

| | | |
|---|---|---|
| TW | 479852 | 3/2002 |
| TW | 480773 | 3/2002 |
| TW | 495106 | 7/2002 |

OTHER PUBLICATIONS

Takamiya, M., et al., "High Performance Electrically Induced Body Dynamic Threshold SOI MOSFET (EIB-DTMOS) with Large Body Effect and Low Threshold Voltage," 1998, IEDM Technical Digest.

Diaz, C.H., et al., "Device Properties in 90nm and beyond and implications on Circuit Design," 2003, IEEE.

Rabaey, J., "Issues in Low Power Design—Managing Leakage," Aug. 23, 2004, Dept. of Electrical Engineering and Computer Sciences, University of California at Berkeley.

Bohr, M., "High Performance Logic Technology and Reliability Challenges," Apr. 1, 2003, IPRS, Intel.

Fallah, et al., "Standby and Active Leakage Current Control and Minimization in CMOS VLSI Circuits," Apr. 2004, IEICE Trans. On Electronics, Special Section on Low-Power LSO and Low Power IP. vol. E88-c, No. 4.

Cao, et al., "Reducing Dynamic Power and Leakage Power for Embedded Systems," Sep. 2002, ASIC-SOC Conference, 15th Annual IEEE International, vol. Uss.

Min. et al., "Zigzag Super Cut-Off CMOS (ZSCCMOS) Block Activation with Self-Adaptive Voltage Level Controller: An alternative to Clock-Gating Scheme in Leakage Dominant Era," 2003 International Solid-State Circuits Conference, Digest of Technical Papers ISSCC, IEEE International.

Henzler, et al., "Fast Power-Efficient Circuit-Block Switch-Off Scheme," Jan. 22, 2004, Electronics Letters, vol. 40. No. 2.

Narendra, et al., "Full Chip Subthreshold Leakage Power Prediction and Reduction Techniques for sub-0.18um CMOS," Mar. 2004, IEEE Journal of Solid State Circuits, vol. 39, No. 2, pp. 501-510.

Kao, et al., "Dual-Threshold Voltage Techniques for Low-Power Digital Circuits," Jul. 2000, IEEE Journal of Solid-State Circuits, vol. 35, No. 7.

Kuroda, et al., "A 0.9-V, 150MHz, 10-mW, 4mm2, 2-D Discrete Cosine Transform Core Processor with Variable Threshold-Voltage (VT) Scheme," Nov. 1996, IEEE Journal of Solid-State Circuits, vol. 31, No. 11.

Tschanz, et al., "Adaptive Body Bias for Reducing Impacts of Die-to-Die and within-die Parameter Variations on Microprocessor Frequency and Leakage, Solid State Circuits Conference," Feb. 2002, Digest of Technical Papers, ISSCC, 2002 IEEE International, vol. 1.

von Arnim, et al., "Efficiency of Body Biasing in 90-nm CMOS for Low-Power Digital Circuits," Jul. 2005, IEEE Journal of Solid State Circuits, vol. 40, No. 7, pp. 1549-1556.

Borkar, S., "Circuit Techniques for Subthreshold Leakage Avoidance, Control, and Tolerance," 2004, IEEE.

* cited by examiner

APPARATUS FOR USING A WELL CURRENT SOURCE TO EFFECT A DYNAMIC THRESHOLD VOLTAGE OF A MOS TRANSISTOR

CROSS REFERENCE TO RELATED APPLICATIONS

This application is a continuation-in-part of U.S. patent application Ser. No. 11/533,332, filed on Sep. 19, 2006, now U.S. Pat. No. 7,683,433, and claims priority to U.S. Provisional Patent Application Ser. No. 61/006,306, filed on Jan. 4, 2008, each of which is incorporated herein in its entirety by this reference thereto.

BACKGROUND OF THE INVENTION

The invention relates to MOS transistors. More specifically, the invention relates to improving drive-strength and leakage of deep submicron MOS transistors when the well becomes a current source.

DESCRIPTION OF THE PRIOR ART

The advantages of dynamically adjustable threshold voltage of metal oxide semiconductor (MOS) transistors with respect to enhancing drive-current or reducing leakage current is known. U.S. Pat. No. 7,224,205, assigned to a common assignee and incorporated herein in its entirety by this reference, provides one such solution, where a diode is connected in a forward bias mode that provides a current, controlled by the transistor input, that modifies the voltage of the transistor's well. This is performed in such a way that, when the transistor is required to supply current, it has a lower threshold voltage than normal and, therefore, increases its drive capability. In the off state, the transistor's threshold is higher, leading to a better leakage characteristic. In actual implementations, the source of the well voltage modification is a forward-biased diode that delivers current to the well from the gate. The well voltage is effectively clamped by the well to a source PN junction diode. The series connection of forward biased diodes creates a voltage divider that modulates the well voltage according to the voltage applied to the gate. It is possible to design this voltage divider to effect the desired changes in well voltage with very little expenditure of current.

In actual implementations it was observed that a relatively high amount of current is sourced to a floating well from the transistor it supports. While it is desired to keep the current in the voltage-dividing diode stack low, on the order of 1 nA, it has been found in some instances that the well acts as a current source, supplying several nAs. This observed behavior is shown in FIG. 1. Below the voltage where the well-to-source PN junction acts as a clamp, i.e. the region marked as 110, at just about 650 mV, the well acts as a current source, i.e. the region marked as 120. This occurs because deep submicron transistors have extremely thin gate oxides, and extremely steep doping gradients. Both of these factors lead to tunnel currents from either the gate or the drain. If the well is not normally grounded, it assumes a voltage of roughly the source junction clamping voltage, i.e. 650 mV. This behavior of the well as a current source is an undesirable effect and should be controlled.

Ebina, in U.S. Pat. No. 6,521,948, suggests the use of a reverse biased PN junction to effect a dynamic threshold. However, in the presence of the currents observed above, Ebina's approach is limited to cases where the well does not operate as a current source, or where its currents are negligible. However, in a deep submicron implementation this is not be the case and, therefore, Ebina would not be applicable.

It would therefore be advantageous to provide a solution that either eliminates or makes use of the current provided by the well when operating in the current source mode.

SUMMARY OF THE INVENTION

Deep submicron wells of MOS transistors, implemented over an ungrounded well, exhibit two modes of operation: a current sink mode and a current source mode. While operation as a current sink is well understood and successfully controlled, it is also necessary to control the current provided in the current source mode of the well. A Schottky diode is connected between the well and the gate, the Schottky diode having a smaller barrier height than that of the PN junction of the well-to-source. For an NMOS transistor, current flows through the PN junction when the gate is high. When the gate is low, current flows through the Schottky diode. This difference of current flow results in a difference in transistor threshold, thereby achieving a dynamic threshold voltage using the current from the well when operating at the current source mode.

DETAILED DESCRIPTION OF THE INVENTION

Deep submicron wells of MOS transistors, implemented over an ungrounded well, exhibit two modes of operation: a current sink mode and a current source mode. While operation as a current sink is well understood and successfully controlled, it is also necessary to control the current provided in the current source mode of the well. Accordingly, a Schottky diode is connected between the well and the gate, the Schottky diode having a smaller barrier height than that of the PN junction of the well-to-source. For a NMOS transistor, current flows through the PN junction when the gate is high. When the gate is low, current flows through the Schottky diode. This difference of current flow results in a difference in transistor threshold, thereby achieving a dynamic threshold voltage using the current from the well when, the transistor operates in the current source mode.

Figure 1:
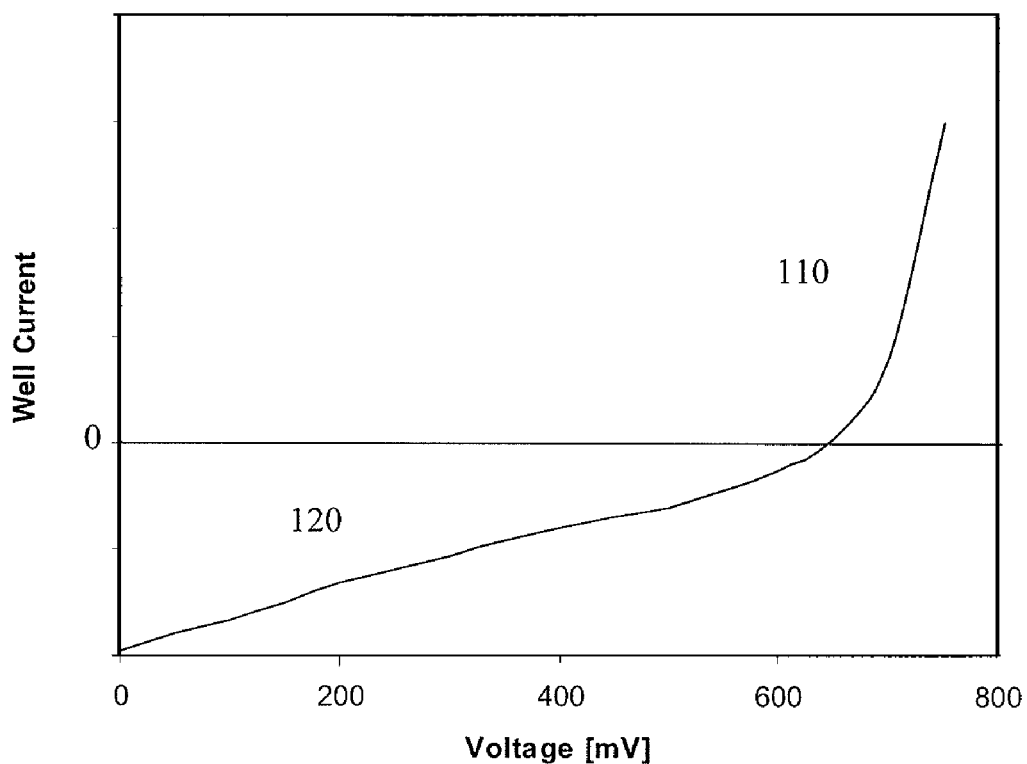
FIG. 1 is a graph showing the behavior of the well of a transistor as a current sink and as a current source (prior art)
Figure 2:
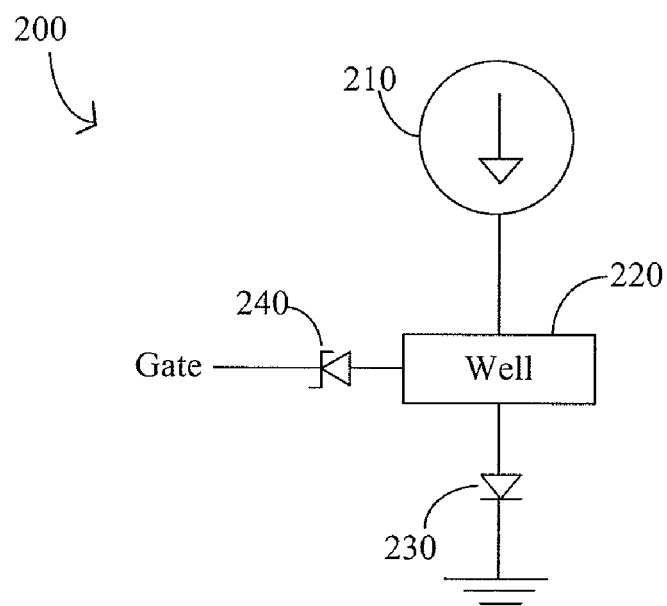
FIG. 2 is a schematic diagram of a control circuit using a Schottky diode to take advantage of the current of the current source mode of the well.
Figure 3:
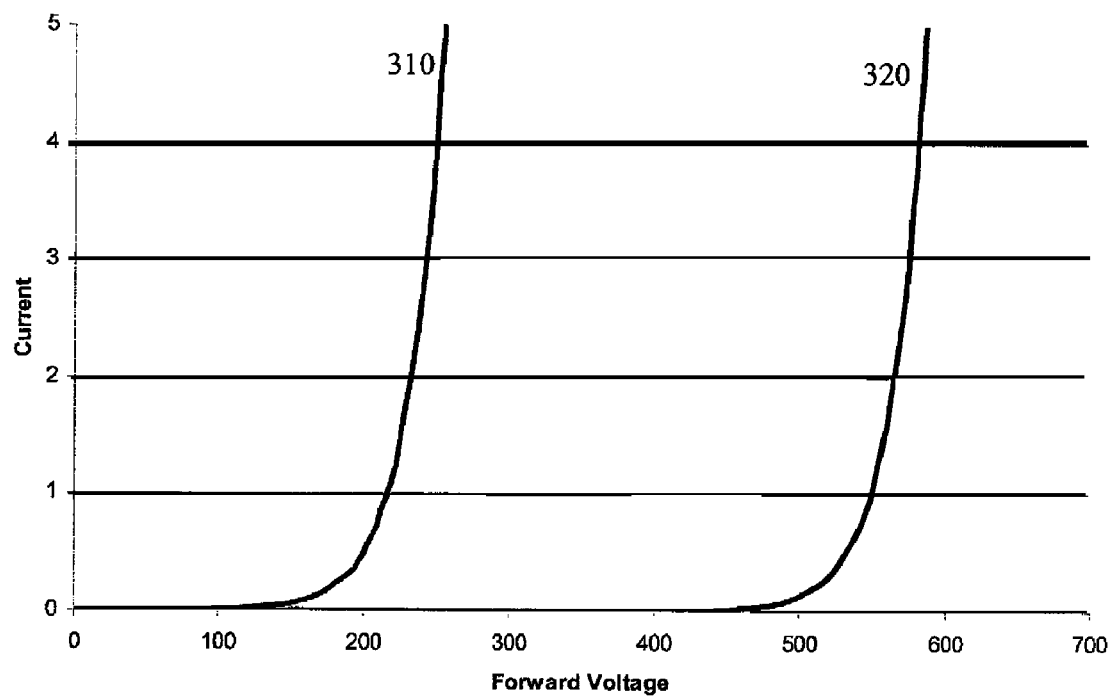
FIG. 3 is a graph comparing the characteristics of a Schottky diode and PN diode.

In an embodiment of the invention, the current supplied when the well acts as a current source is controlled by using the gate to control the well voltage. FIG. 2 is a schematic diagram showing control circuit 200 that uses a Schottky diode 240 to take advantage of the current of the current source 210 mode of the well 220. When the gate voltage is low, the Schottky diode 240 acts as a clamp, holding the well 240 one diode drop above the low gate voltage. For the desired threshold modulation, the diode 240 has a lower turn-on voltage than the well-to-source PN junction 230. This criterion is satisfied by the Schottky diode 240. In a 90 nm CMOS embodiment, cobalt silicide is used as a conductance enhancing layer. In one embodiment of the invention, $CoSi_2$ is used as one side of the Schottky diode 240. When the silicide is placed in contact with a P-well, the effective barrier height is approximately 0.46 volts, compared to a PN junction 230 barrier of typically 0.8 volts. This indicates that the well voltage may be modulated by about 0.34 volts, which is sufficient to effect a useful change in $V_T$. The characteristics of the diode 240 and the PN junction 230 are shown in FIG. 3 by curves 310 and 320, respectively.

Figure 4:
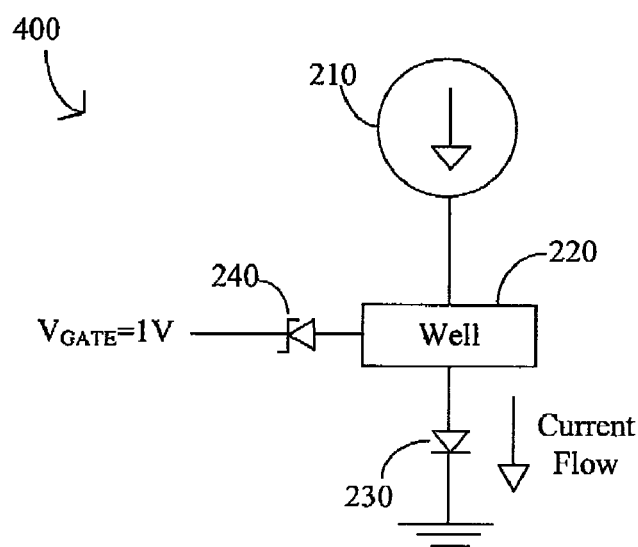
FIG. 4 is a schematic diagram illustrating the operation of an embodiment of the invention when the well in a current sink mode.

FIG. 4 is a schematic diagram that illustrates the operation of an embodiment of the invention when the well is in a current sink mode 400. When the gate voltage $V_{GATE}$ is high, e.g., one volt, current flow is through the PN junction 230 formed by the well-to-source diode. This establishes a relatively high voltage on the well, on the order of 0.5 volts, based on the curves shown in FIG. 3. Because the Schottky diode 240 that is between the gate and the well is reverse biased, there will be relatively little current flow through that device, and what flow there is tends to increase the well voltage because it adds to the current supplied from the transistor, as represented by the internal current source 210.

Figure 5:
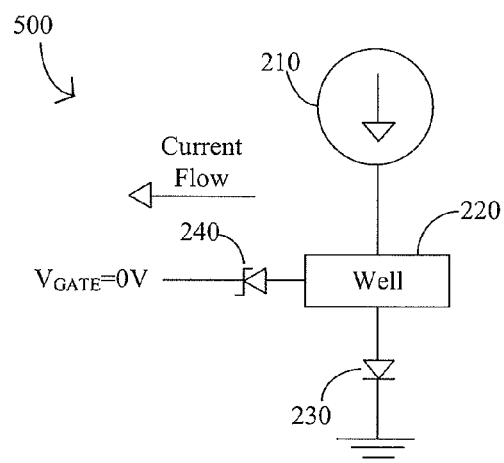
FIG. 5 is a schematic diagram illustrating the operation of an embodiment of the invention when the well in a current source mode.

FIG. 5 is a schematic diagram illustrating the operation of an embodiment of the invention when the well is in a current source mode 500. In this embodiment, where the gate voltage is low, the current from the transistor's internal current sources 210 tends to flow through the Schottky diode 240 because its turn-on voltage is much lower than that of the PN junction diode. This pulls the well voltage down to about 0.2 volts in the conditions described herein, based on the curves shown in FIG. 3. The difference in well 220 voltage creates a difference in threshold voltage, so that there is more drive current available than expected from a fixed well voltage. Because the well is always at a voltage which is positive with respect to the source, a transistor of this should have a heavier than normal threshold voltage implant, e.g., approximately $10^{13}$ ions/cm$^2$. Because the currents are small, it would be advantageous in an embodiment of the invention to place a capacitance between the gate and the well. This capacitance enables the well potential to change rapidly, and enhances the transient drive capability of the transistor.

Figure 6:
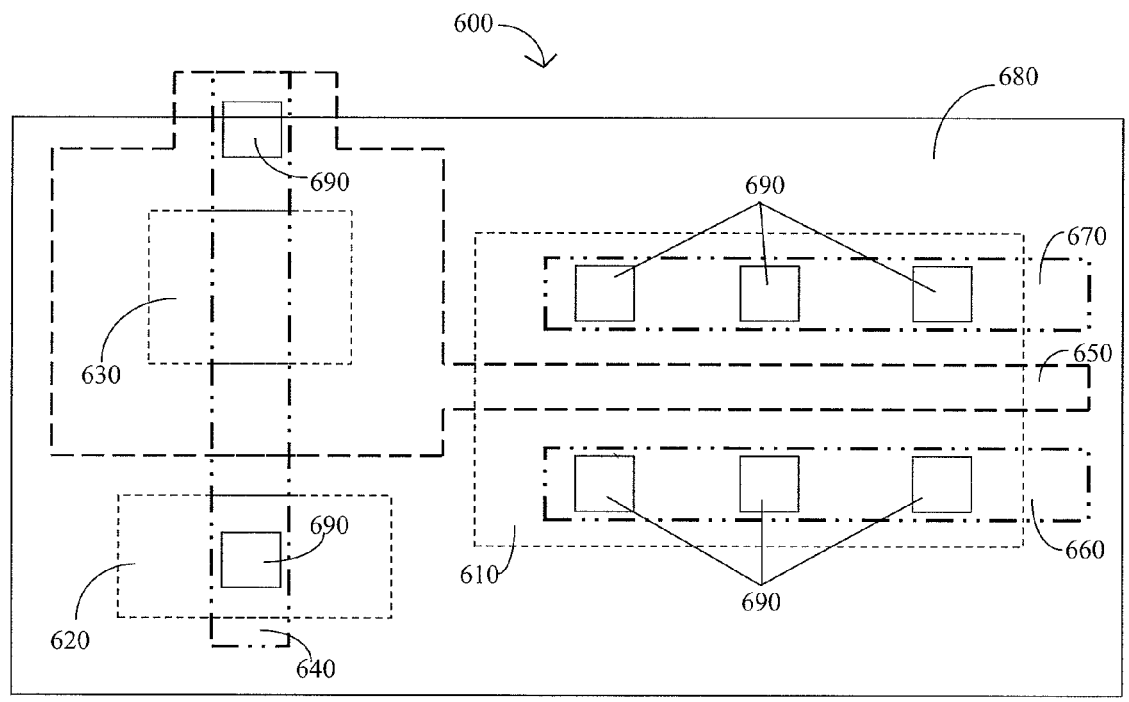
FIG. 6 shows the layout of a transistor implemented in accordance with of an embodiment of the invention.

FIG. 6 illustrates a layout 600 of a transistor implemented in accordance with an embodiment of the invention. Three active regions are marked as 610, where the transistor is formed 620, where the diode 240 is formed, and where a capacitor is formed 630. The Schottky diode 240 is formed by eliminating P+ and N+ implants from its active region. When $CoSi_2$ is formed in that active region, without P+ or N+ doping, the result is a Schottky diode. A metal line 640 contacts the gate 650 of the transistor, the Schottky diode 240, and the capacitor, forming the input to the transistor. The metal lines 660 and 670 contact the source and drain regions of the transistor, respectively. The entire structure is formed in a well 680.

Figure 7:
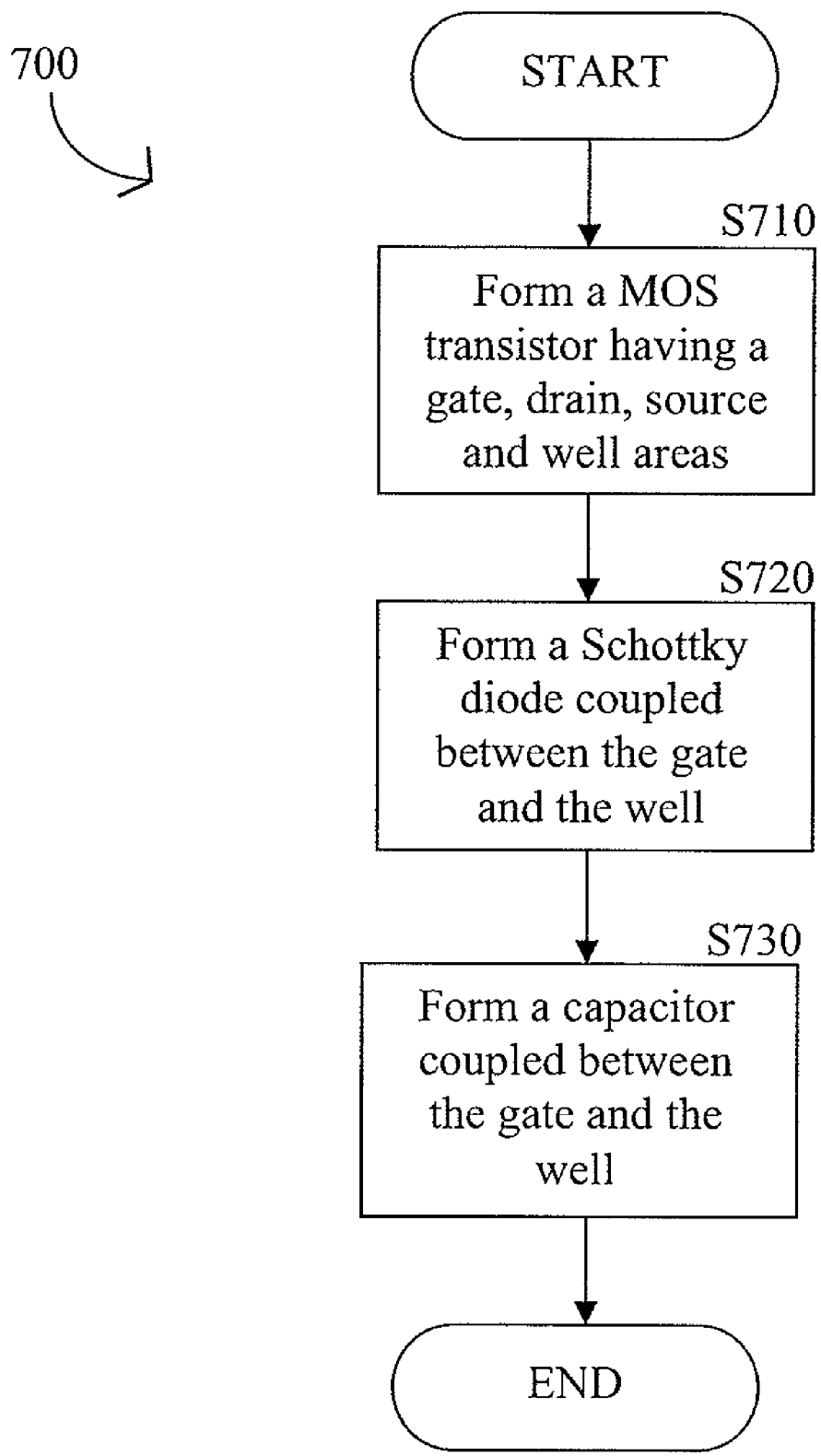
FIG. 7 is a flowchart showing the steps for creating a transistor in accordance with an embodiment of the disclosed invention.

FIG. 7 is a flowchart 700 that shows the steps for creating a transistor in accordance with an embodiment of the invention. In step S710, an NMOS transistor is formed in a well, the MOS having a gate region, a drain region, a source region, and a well region. In step S720, a Schottky diode is formed with its anode coupled to the well and its cathode coupled to the gate of the NMOS transistor. In step S720, a capacitor is formed between the gate and the well, essentially in parallel to the Schottky diode.

Figure 8:
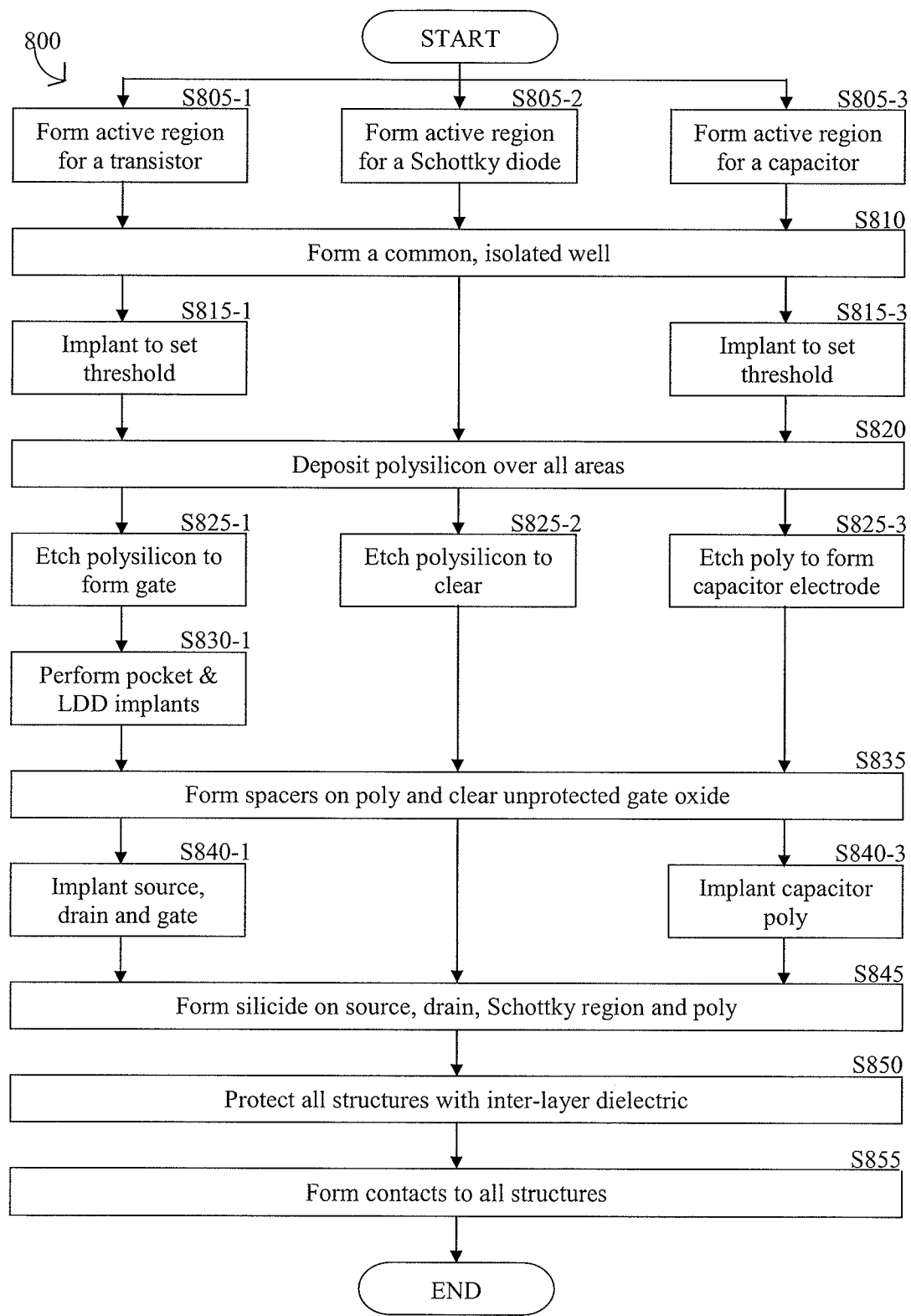
FIG. 8 is a flowchart showing the steps for creating a transistor in accordance with an embodiment of the invention.

FIG. 8 shows a process flow implementing the transistor in accordance with an embodiment of the invention. In steps S805-1, S805-2, and S805-3, the active areas of the transistor 610, the Schottky diode 620, and the capacitor are formed, respectively. In step S810, a common isolated well 680 is formed. In steps S815-1 and S815-3, an implant is performed to set the threshold voltage for the transistor and the capacitor, respectively. The transistor can be implemented without the capacitor, as discussed above. In step S820, polysilicon, also referred to as poly, is deposited on the entire area. In steps S825-1, S825-2, and S825-3, an etch is performed to remove polysilicon and thus form the gate 650, to clear over the Schottky diode, and to form the capacitor electrode respectively. In step S830-1, pocket and lightly doped drain (LDD) implants are made. In step S835, spacers are formed on the polysilicon and unprotected gate oxide is removed. In step S840-1, implant of the transistor's source, drain, and gate takes place; while in step S840-3, the implant of the capacitor poly takes place. In step S845, silicide is formed on the source and the drain of the transistor, over the Shottcky region and over the poly of the capacitor. In step S850, protection of all structures is performed by applying an inter-layer dielectric. In step S855, contacts 690 to all structures are formed.

Figure 9:
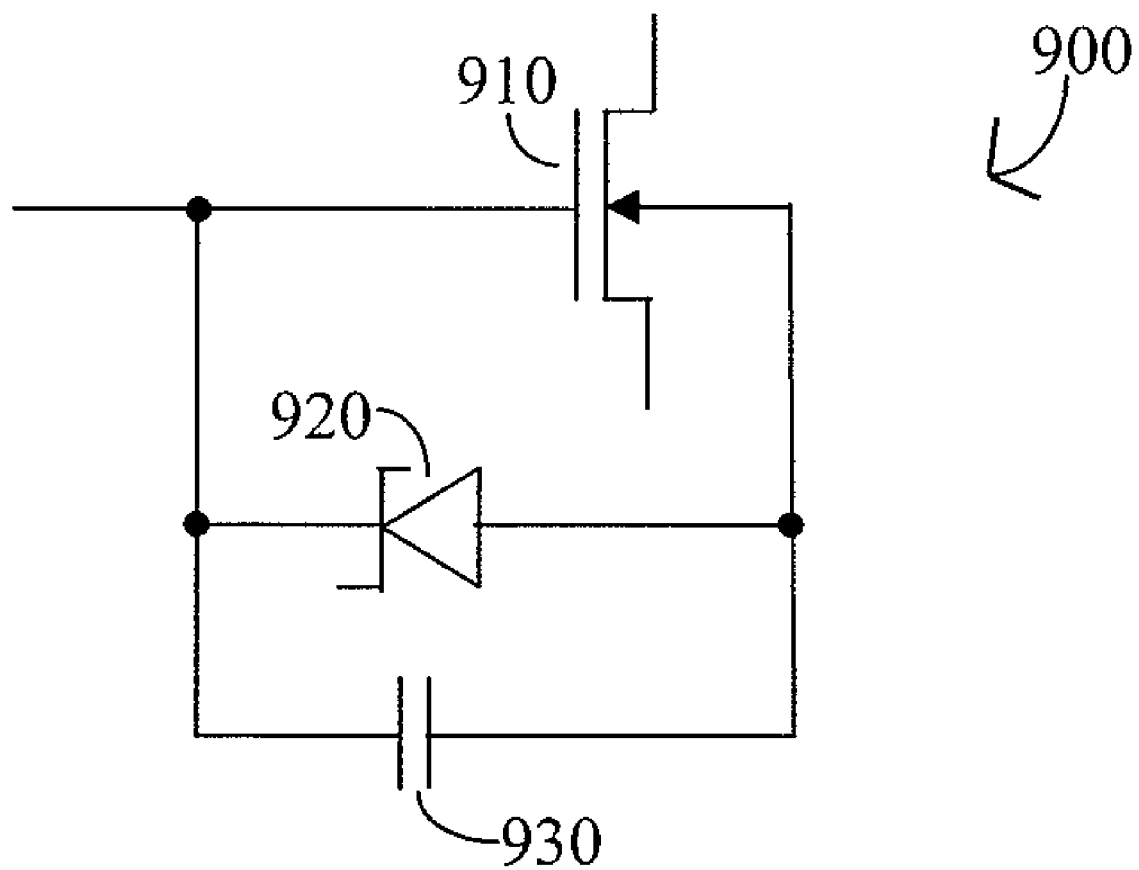
FIG. 9 is a schematic diagram showing a leakage control circuit using a Schottky diode and a capacitor, according to an embodiment of the invention.

FIG. 9 is a schematic diagram of the leakage control circuit 900 according to the embodiment of the invention. The NMOS transistor 910 is connected to a Schottky diode 920 such that the diode's anode terminal is coupled to the well of the NMOS transistor 910, and the cathode terminal of the diode is coupled to the gate of the NMOS transistor 910. A capacitor 930 is connected in parallel with the Schottky diode 920 with one terminal connected to the anode of the Schottky diode 920 and the other terminal connected to the cathode of the Schottky diode 920. The schematic of FIG. 9 corresponds to the layout shown in FIG. 6.

A person skilled in the art would readily note that the descriptions herein where described with respect to a NMOS transistor. Such a person would further realize that it is straightforward to adapt the teachings herein for the purpose of PMOS transistors, with the applicable changes required due to the different polarity of the PMOS transistor. The same material $CoSi_2$ also creates a useful Schottky diode with N-type silicon. In this case, the nominal barrier is somewhat higher, i.e. 0.64 volts, but can be reduced by controlling the well doping. It is therefore apparent that the well voltage can be modulated by at least 200 mV, which is sufficient to effect useful $V_T$ modulation. Other materials, such as $NiSi_2$, may be used to act as a conductivity enhancing layer. Such material is also a useful Schottky barrier diode material, both with respect to a P-well and with respect to an N-well. Shottky diodes using different silicides may be provided on the same integrated circuit (IC). It would be further noted by an artisan that the principles of the invention disclosed hereinabove are applicable to both bulk MOS implementations, as well as various types of semiconductor over insulator (SOI) implementations, without departing from the teachings herein.

Accordingly, although the invention has been described in detail with reference to a particular preferred embodiment, persons possessing ordinary skill in the art to which this invention pertains will appreciate that various modifications and enhancements may be made without departing from the spirit and scope of the claims that follow.

The invention claimed is:

1. An apparatus, comprising:
   a MOS transistor having a source terminal, a drain terminal, a gate terminal and a well terminal;
   a control diode coupled between said well terminal and said gate terminal, said control diode constructed to provide a barrier voltage that is sufficiently below a barrier voltage of a diode formed between said well terminal of said MOS transistor and said source terminal of said MOS transistor, to effect a dynamic threshold voltage control; and
   a capacitor coupled between said well terminal of said MOS transistor and said gate terminal of said MOS transistor and constructed to exhibit any of the properties of changing said well potential rapidly and enhancing transient drive capability of said MOS transistor;
   wherein said apparatus is so constructed that said control diode is forward biased when gate voltage of said MOS transistor is approximately equal to source voltage of said MOS transistor, and
   wherein said control diode is constructed to act as a clamp that holds said well at one diode voltage drop above a low gate voltage.

2. The apparatus of claim 1, said MOS transistor comprising:
   a first active area of a first conductivity type formed in said well; and
   a gate formed over said first active area to define of a drain region and a source region.

3. The apparatus of claim 1, wherein said control diode comprises a Schottky diode.

4. The apparatus of claim 3, said Schottky diode comprising:
   a second active area of a first conductivity type formed in said well; and
   a metal contact formed with respect to said second active area.

5. The apparatus of claim 3, wherein one side of said Schottky diode is formed of a silicide.

6. The apparatus of claim 5, wherein said silicide comprises one of CoSi2 and NiSi2.

7. The apparatus of claim 1, said capacitor further comprising:
   a third active area of a first conductivity type formed in said well; and
   a polysilicon area formed over said third active area.

8. The apparatus of claim 1, wherein said MOS transistor comprises one of an NMOS transistor and a PMOS transistor.

9. An integrated circuit comprising at least one said NMOS transistor and at least one said PMOS transistor of claim 8, wherein said control diode of said at least NMOS transistor is constructed of a first silicide type and wherein said control diode of said at least PMOS transistor is constructed of a second silicide type.

* * * * *